US009917427B2

(12) United States Patent
Rost et al.

(10) Patent No.: US 9,917,427 B2
(45) Date of Patent: Mar. 13, 2018

(54) UNDERGROUND UTILITY BOX ASSEMBLY

(71) Applicant: SEAHORSE INDUSTRIES LTD., Las Vegas, NV (US)

(72) Inventors: Kevin L. Rost, Oak Glen, CA (US); Hardy L. Rost, Cookville, TN (US)

(73) Assignee: Seahorse Industries Ltd., Las Vegas, NV (US)

(*) Notice: Subject to any disclaimer, the term of this patent is extended or adjusted under 35 U.S.C. 154(b) by 589 days.

(21) Appl. No.: 14/450,530

(22) Filed: Aug. 4, 2014

(65) Prior Publication Data

US 2014/0374133 A1    Dec. 25, 2014

Related U.S. Application Data

(63) Continuation-in-part of application No. 13/488,253, filed on Jun. 4, 2012, now Pat. No. 8,796,548.

(51) Int. Cl.
H02G 3/08 (2006.01)
H02G 9/00 (2006.01)
H05K 5/06 (2006.01)

(52) U.S. Cl.
CPC .............. H02G 3/088 (2013.01); H02G 9/00 (2013.01); H05K 5/061 (2013.01)

(58) Field of Classification Search
USPC ........................................... 174/67; 220/378
See application file for complete search history.

(56) References Cited

U.S. PATENT DOCUMENTS 3,166,332 A * 1/1965 Olson .................... F16J 15/106
                                                220/378
4,192,520 A * 3/1980 Hasegawa ............... F02F 7/006
                                                277/591
(Continued)

FOREIGN PATENT DOCUMENTS

CN    201758373 U    3/2011
EP         2164143    3/2010
(Continued)

OTHER PUBLICATIONS

Office Action on corresponding foreign application (TW 104125285) from the Taiwan Intellectual Property Office dated Apr. 13, 2016.

(Continued)

Primary Examiner — William H Mayo, III
Assistant Examiner — Krystal Robinson
(74) Attorney, Agent, or Firm — Klein, O'Neill & Singh, LLP

(57) ABSTRACT

A utility box assembly includes a housing structure having an open upper end, a first peripheral channel around the open upper end, and a second peripheral channel disposed below the first peripheral channel and inwardly therefrom. A first sealing element is seated in the first peripheral channel, and a second sealing element is seated in the second peripheral channel. A cover is configured to cover the open upper end. The cover has an outer peripheral portion configured to engage the first sealing element, and a downward-depending flange configured to engage the second sealing element. A liquid-tight seal is provided by the compression of the first and second sealing elements within their channels when the cover is secured to the open upper end of the housing.

15 Claims, 6 Drawing Sheets

(56) References Cited

U.S. PATENT DOCUMENTS

| | | | | |
|---|---|---|---|---|
| 4,265,365 | A | * | 5/1981 | Boteler ................. H02G 3/088 174/53 |
| 4,620,061 | A | * | 10/1986 | Appleton ................ H02G 3/14 174/51 |
| 4,665,654 | A | * | 5/1987 | Stedron .................. H02B 1/28 49/401 |
| 4,934,715 | A | * | 6/1990 | Johnson ................. E02D 29/14 220/378 |
| 5,050,764 | A | * | 9/1991 | Voss ...................... F16J 15/062 220/327 |
| 5,574,254 | A | * | 11/1996 | Mori ..................... H02G 3/088 174/561 |
| 6,577,817 | B2 | | 6/2003 | Harris |
| 7,376,325 | B1 | | 5/2008 | Cloud et al. |
| 7,576,972 | B2 | * | 8/2009 | Savary .................. H01G 2/103 361/328 |
| 8,101,859 | B2 | | 1/2012 | Zadesky |
| 8,454,101 | B2 | * | 6/2013 | Kuo ....................... A45C 5/03 220/377 |
| 2001/0040037 | A1 | * | 11/2001 | Negishi ................. H05K 5/061 174/17 CT |
| 2003/0010783 | A1 | * | 1/2003 | Prezelin ................ B65D 51/16 220/324 |
| 2010/0077681 | A1 | | 4/2010 | McCleskey |
| 2011/0084086 | A1 | | 4/2011 | Rost et al. |

FOREIGN PATENT DOCUMENTS

| | | |
|---|---|---|
| JP | 0739043 | 2/1995 |
| JP | 2891324 | 5/1999 |
| JP | 2013105931 | 5/2013 |
| TW | 201404685 | 2/2014 |
| WO | WO 96/37938 | 11/1996 |
| WO | WO 97/33803 | 9/1997 |

OTHER PUBLICATIONS

Office Action on corresponding foreign application (CN 201380028840.2) from the PRC Intellectual Property Office dated Aug. 3, 2016.
International Search Report on PCT application (PCT/US2015/043445) from International Searching Authority (KIPO) dated Oct. 30, 2015.
Written Opinion on PCT application (PCT/ US2015/043445) from International Searching Authority (KIPO) dated Oct. 30, 2015.
International Search Report on PCT application (PCT/US2013/043729) from International Searching Authority (KIPO) dated Aug. 27, 2013.
Written Opinion on PCT application (PCT/US2013/043729) from International Searching Authority (KIPO) dated Aug. 27, 2013.
Office Action on corresponding foreign application (TW 102119827) from the Taiwan Intellectual Property Office dated Oct. 16, 2014.
Office Action on corresponding foreign application (TW 104125285) from the Taiwan Intellectual Property Office dated Nov. 23, 2016.
Office Action on corresponding foreign application (TW 104125285) from the Taiwan Intellectual Property Office dated Jul. 18, 2017.
Office Action on corresponding foreign application (CN 201580041698.4) from the PRC State Intellectual Property Office (SIPO) dated Jan. 3, 2018.

* cited by examiner

UNDERGROUND UTILITY BOX ASSEMBLY

CROSS-REFERENCE TO RELATED APPLICATIONS

This application is a continuation-in-part of U.S. patent application Ser. No. 13/488,253, filed on 4 Jun. 2012, issuing as U.S. Pat. No. 8,796,548, the disclosure of which is incorporated herein by reference in its entirety.

FEDERALLY SPONSORED RESEARCH OR DEVELOPMENT

Not Applicable

BACKGROUND

The present disclosure relates to underground utility boxes and receptacles (sometimes called "vaults"), such as those used in cable TV systems, telephone systems, electric utilities, and water utilities (such as, for example, irrigation systems). More specifically, it relates to a utility box assembly for use with an underground utility box or receptacle. Hereinafter, the term "utility box" will be used for simplicity, without limitation to the shape or configuration of the receptacle.

A typical underground utility box is placed within a hole in the ground so that only the top cover of the box is exposed. The utility box may contain a variety of different devices and instruments. For example, in a water utility application, the utility box may contain one or more valves and/or flow meters.

Many devices housed within an underground utility box are sensitive to water. Therefore, it is advantageous that the utility box resist water penetration. Further, a sealed utility box resists entry by rodents that may gnaw on electrical wiring within the box, and spiders, snakes and bees that may present a danger to workers who open the box. Moreover, sealing against dirt, dust, and debris may also advantageously enhance reliability and reduce maintenance costs.

SUMMARY

The various embodiments of the present utility box assembly have several features, no single one of which is solely responsible for their desirable attributes. Without limiting the scope of the present embodiments as expressed by the claims that follow, their more prominent features now will be discussed briefly. After considering this discussion, and particularly after reading the section entitled "Detailed Description of the Preferred Embodiments," one will understand how the features of the present embodiments provide the advantages described herein.

According to one aspect of the disclosure, a utility box assembly comprises a housing having an open upper end, a first peripheral channel around the open upper end, and a second peripheral channel disposed below the first peripheral channel and inwardly therefrom; a first sealing element seated in the first peripheral channel; a second sealing element seated in the second peripheral channel; and a cover configured to cover the open upper end. The cover has an outer peripheral portion configured to engage the first sealing element and a downward-depending flange configured to engage the second sealing element. A liquid-tight seal is provided by the engagement of the first and second sealing elements between the cover and the housing.

According to another aspect of the disclosure, a utility box assembly comprises a housing having an open upper end and a peripheral channel around the open upper end, the peripheral channel being defined by a bottom surface between opposing side walls; a cover configured to be secured to the housing so as to cover the open upper end, the cover having a peripheral element; and a sealing element seated in the peripheral channel, the sealing element having a main body configured to be engaged by the peripheral element of the cover and first and second legs extending downward from opposite sides of the main body, wherein the sealing element is resiliently deformable by the engagement of the peripheral element of the cover with the main body so as to urge the first and second legs of the sealing element against the side walls defining the channel.

According to another aspect of the disclosure, a sealing element is provided for a utility box assembly comprising a housing with an open end, and a cover configured to fit onto the housing so as to cover the open end, wherein the housing has a peripheral channel around the open end, the channel being defined by a bottom surface between opposing side walls, and wherein the cover has a peripheral element. The sealing element is configured to be received in the peripheral channel, and it comprises a main body configured to be engaged by the peripheral element of the cover, and first and second legs extending downward from opposite sides of the main body, wherein, when the sealing element is seated in the channel, it is resiliently deformable by the engagement of the peripheral element of the cover with the main body so as to urge the first and second legs of the sealing element against the side walls defining the channel.

BRIEF DESCRIPTION OF THE DRAWINGS

The various embodiments of the present sealing cover assembly will be discussed in detail with an emphasis on highlighting the advantageous features. These embodiments are depicted in the accompanying drawings, which are for illustrative purposes only. These drawings include the following figures, in which like numerals indicate like parts.

DETAILED DESCRIPTION

Figure 1:
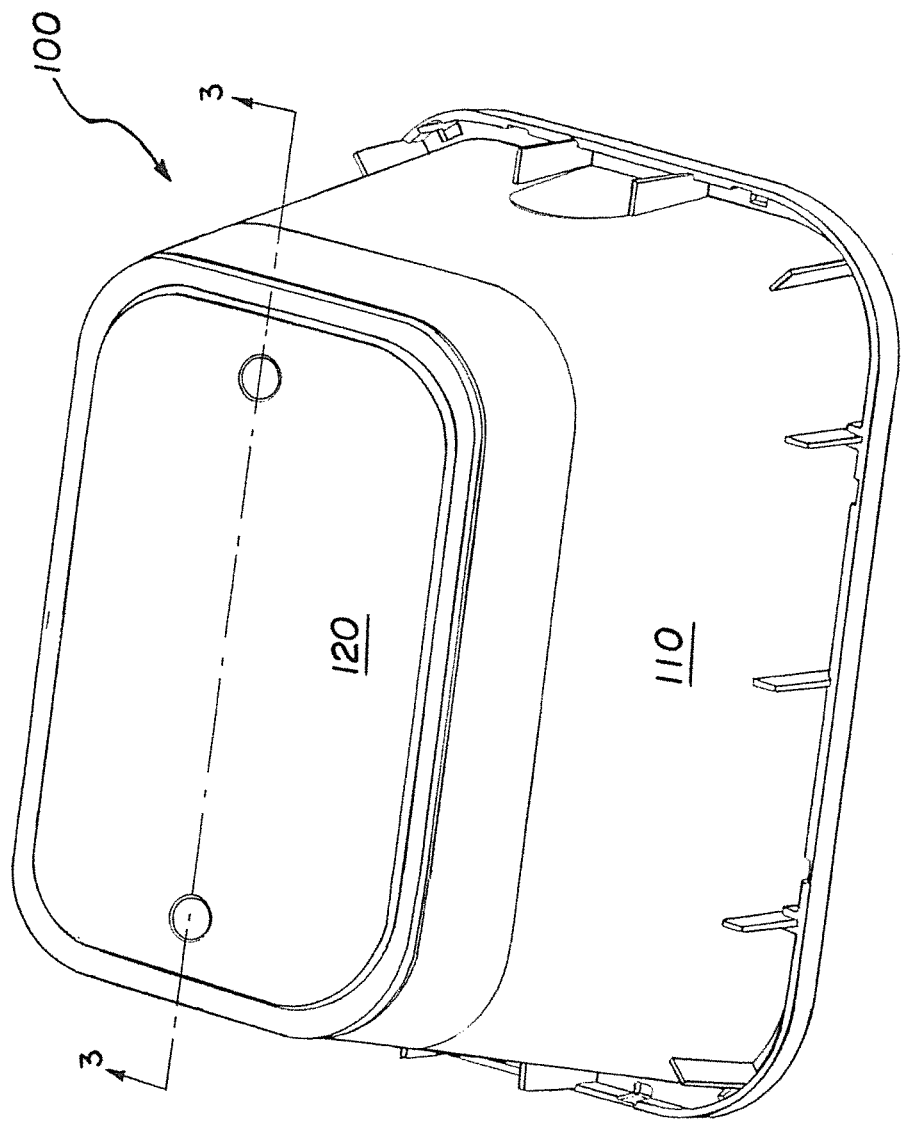
FIG. 1 is a top perspective view of an underground utility box in accordance with an embodiment of the present disclosure.
Figure 2:
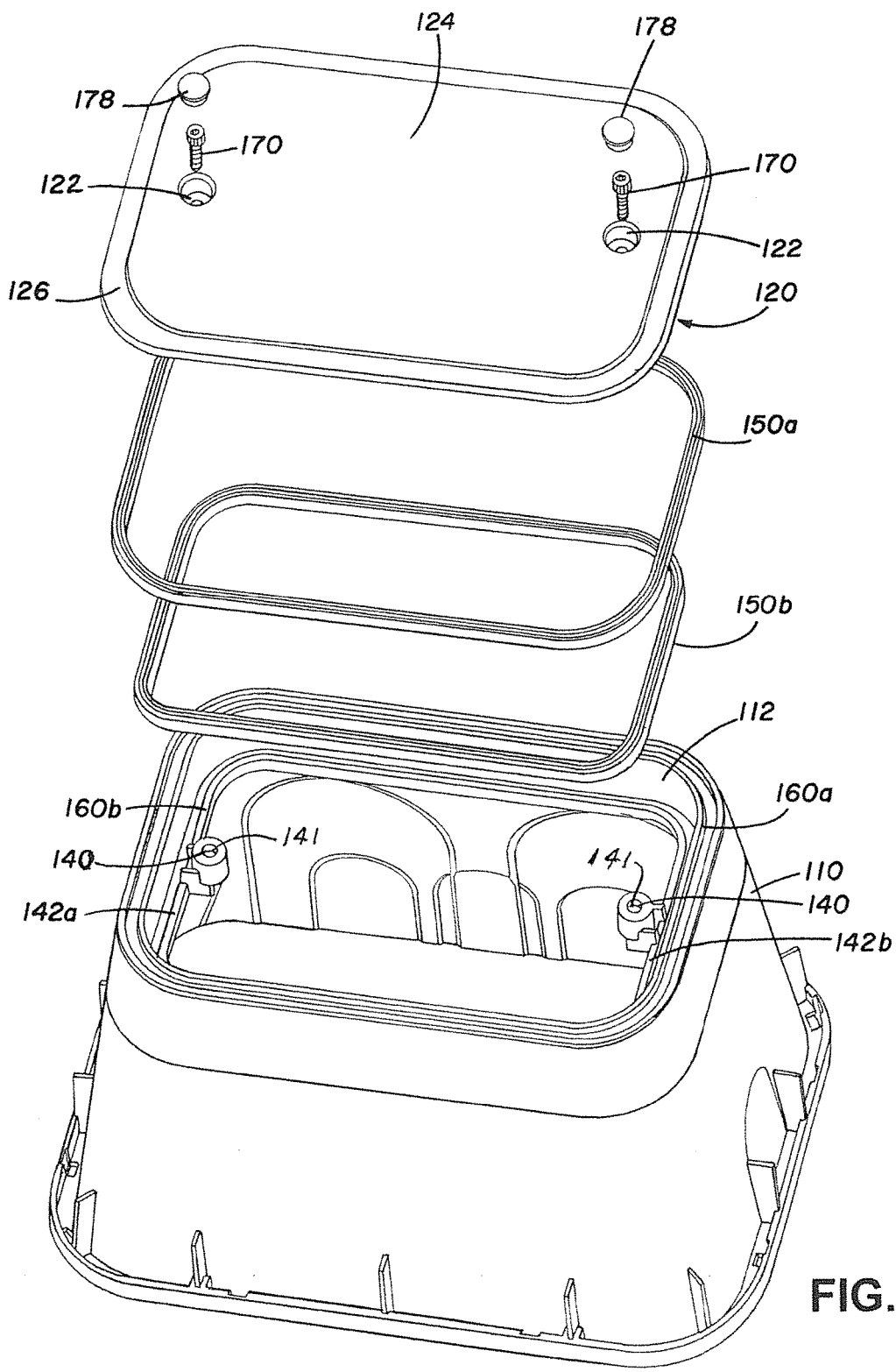
FIG. 2 is an exploded front perspective view of an underground utility box in accordance with an embodiment of the present disclosure.

FIGS. 1-4 illustrate an embodiment of the present utility box assembly 100. FIG. 2 illustrates components of the utility box assembly 100 exploded for clarity. The illustrated embodiment includes a housing structure 110, a top cover 120, and at least first and second peripheral sealing elements or gaskets 150*a*, 150*b*, respectively, sandwiched between the housing structure 110 and the cover 120, as will be described in detail below. In many applications, a bottom cover (not shown) may be installed on the bottom of the housing structure 110.

The sealing elements or gaskets 150a, 150b may be made of any suitable material that is resilient and elastomeric, such as, for example, ethylene propylene diene monomer (EPDM) rubber, fluoropolymer elastomers (such as that marketed by DuPont Performance Elastomers under the mark VITON®), Buna N (nitrile) rubber (copolymer of butadiene and acrylonitrile) or neoprene, with Buna N rubber being preferred.

In the illustrated embodiments, the housing structure 110 is hollow and substantially trapezoidal in shape with rounded corners, but this configuration is only one example and not limiting. The housing structure 110 is open at the bottom and has an open upper end 112, and it advantageously includes first and second peripheral seating channels 160a, 160b around the open upper end 112, each of the first and second seating channels 160a, 160b being defined by a pair of opposed side walls. The first and second seating channels are configured to receive the first and second sealing elements or gaskets 150a, 150b, respectively (in the embodiment of FIGS. 1-4), or first and second sealing elements 250a, 250b, respectively (in the embodiment of FIGS. 5 and 6, described below). In some embodiments, the first seating channel 160a is provided in a top surface of a vertical rim 114 peripherally surrounding the open upper end 112 of the housing structure 110, and the second seating channel 160b is provided in a peripheral shoulder 116 extending inwardly from the interior wall surfaces of the housing structure 110. The shoulder 116 is positioned below the first seating channel 160a and inwardly therefrom, and thus the second seating channel 160b is likewise positioned relative to the first seating channel 160a. Although the illustrative embodiments show the utility box assembly as including two seating channels 160a, 160b and two sealing elements or gaskets, it will be appreciated that the number and configuration of the seating channels 160a, 160b and sealing elements or gaskets are exemplary only and not limiting. For example, in some embodiments, only a single seating channel and a single sealing element may be sufficient, or even preferable, depending on the application.

The housing structure 110 further includes at least first and second fastener receptacles 140, which are positioned on interior walls of the housing structure. Each of the fastener receptacles 140 is in the shape of a hollow cylinder having an interior bore 141 that is perpendicular to a plane defined by the cover 120 when the cover 120 is installed on the housing structure 110. Each of the fastener receptacle bores 141 is configured to receive a threaded fastening member or fastener 170, which may be a screw or bolt, for example, for securing the cover 120 to the housing structure 110. Preferably, the first and second fastener receptacles 140 are respectively fixed to opposite interior housing walls 142a, 142b, as best shown in FIG. 2. In some embodiments, additional fastener receptacles (not shown) may be provided on the two remaining interior walls.

The cover 120 is substantially rectangular in shape and of a size corresponding to the open upper end 112 of the housing structure 110. The cover 120 includes at least first and second cover apertures 122. The cover apertures 122 are located in the cover 120 so as to be in registry with the bores 141 of the fastener receptacles 140 when the cover 120 is installed on the open upper end 112 of the housing structure 110. Thus, when the cover 120 is installed, the registration of each of the cover apertures 122 with its respective fastener receptacle bore 141 allows one of the fastening members 170 to be installed through each registered aperture/bore pair. If the housing structure 110 includes additional fastener receptacles, as noted above, the cover 120 will have additional cover apertures (not shown) corresponding to, and in registry with, the additional fastener receptacles.

Figure 3:
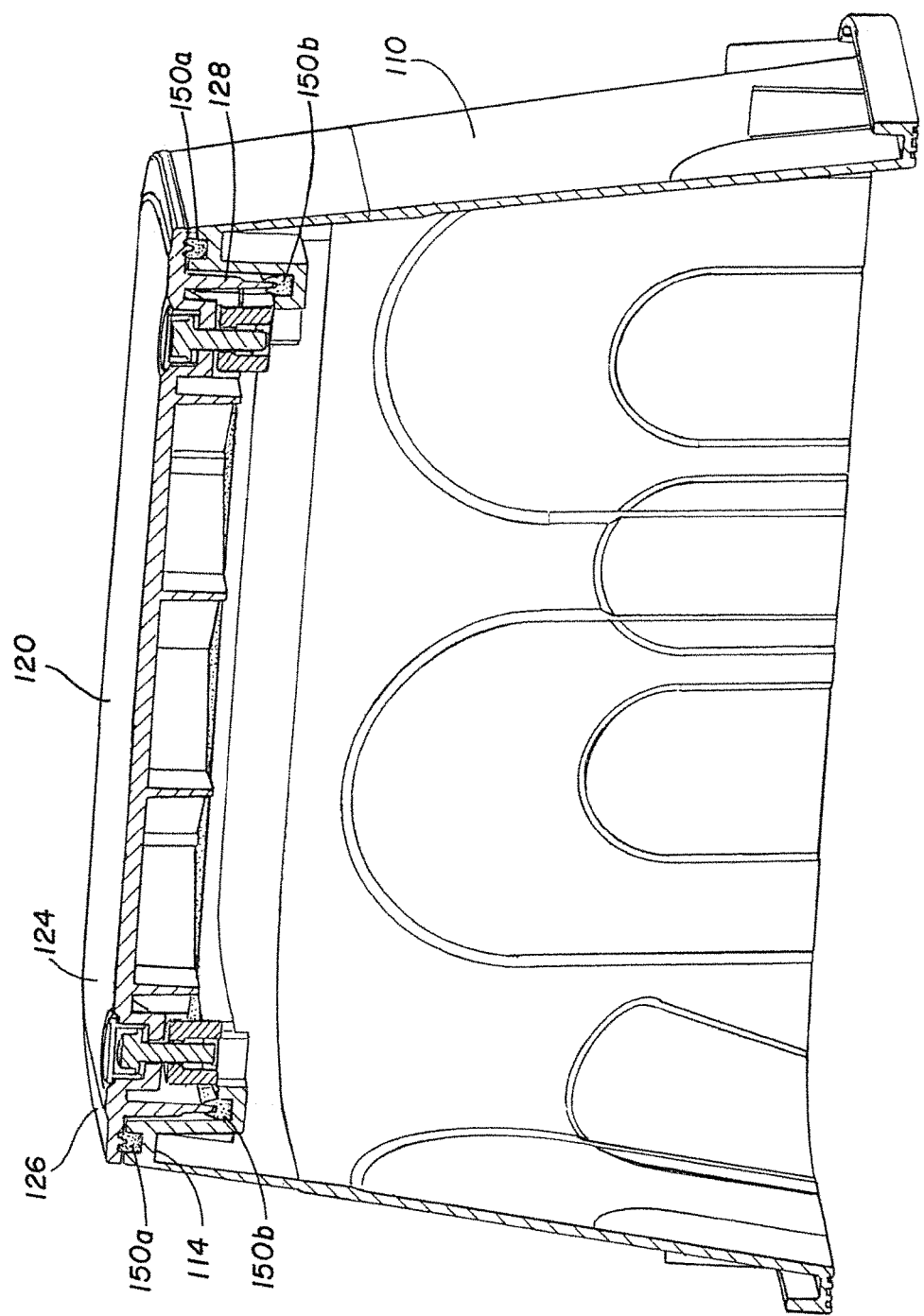
FIG. 3 is a cross sectional view of an underground utility box in accordance with an embodiment of the present disclosure.
Figure 4:
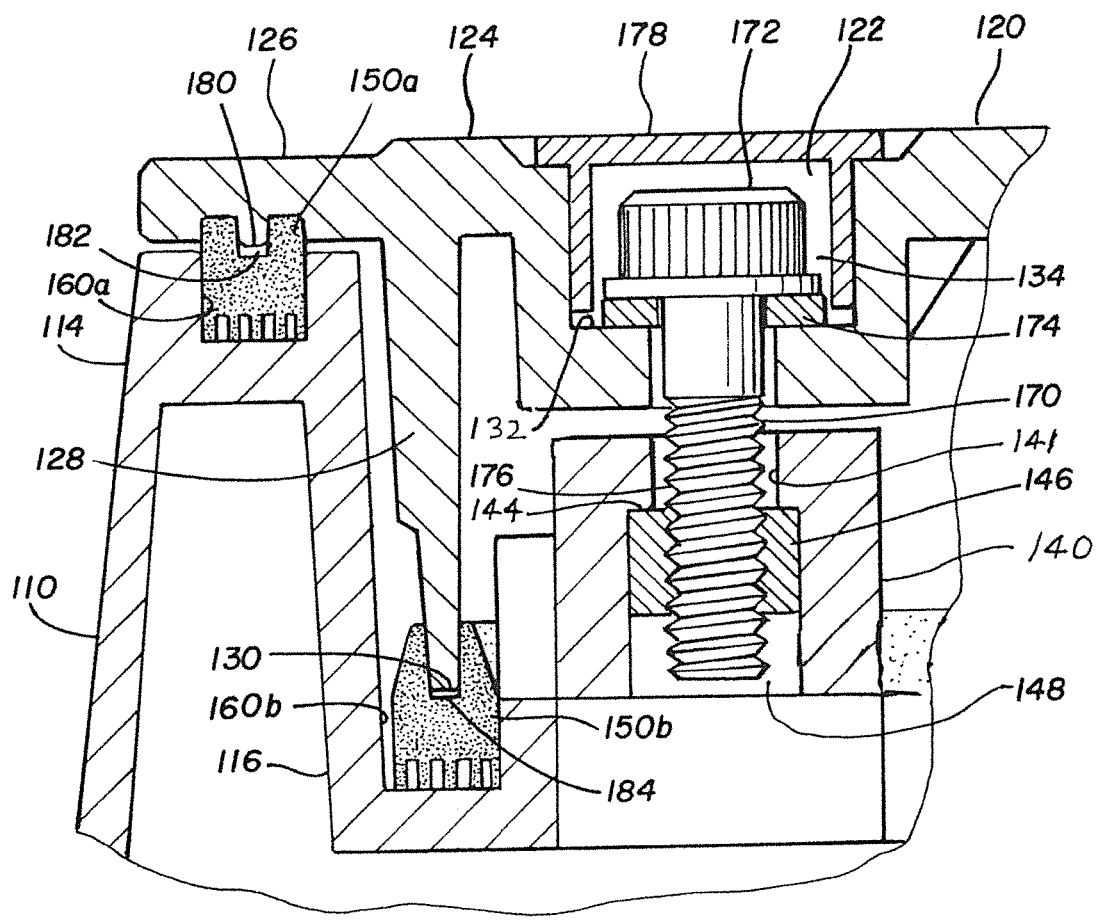
FIG. 4 is a cross-sectional detail view of a portion of the underground utility box shown in FIG. 3.

Referring to FIGS. 3 and 4, the cover 120 is advantageously configured to include a central portion 124 in which the cover apertures 122 are located, and an outer peripheral portion or frame 126. The central portion is 124 is configured to cover the open upper end 112 of the housing, while the frame 126 is configured to seat against the vertical rim 114 of the housing 110. A peripheral vertical flange 128 extends downward from the bottom (interior) surface of the cover 120 approximately at the juncture of the central portion 124 and the frame 126 of the cover 120. The flange 128, which is dimensioned to fit into the open upper end 112 of the housing structure, inward from the peripheral rim 114 thereof, terminates in a bottom edge 130. As will be explained below, when the cover 120 is installed on the housing structure 110, peripheral structure on the underside of the cover frame 126 engages against the first sealing element 150a, while the bottom edge 130 of the vertical flange 128 engages against the second seating element 150b.

The housing structure 110 and the cover 120 may be constructed of a durable, weather-resistant material that is capable of withstanding prolonged outdoor exposure. Plastics are preferred since they do not corrode and are typically lightweight. Examples of preferred materials include high-density polyethylene (HDPE) or UV-stabilized polyvinyl chloride (UV-PVC), with HDPE being preferred.

Still referring to FIGS. 3 and 4, the first cover aperture 122 passes through the cover 120 and extends to a recessed interior annular seat 132 formed on the underside of the cover 120. The seat 132 restricts the vertical movement of the fastener 170 relative to the cover 120. The bore 141 of the first fastener receptacle is dimensioned to receive the fastener 170, and it advantageously includes an annular seat 144 that is configured to hold, in a fixed position, a nut 146 or the like to secure the fastener 170. The fastener 170 and the nut 146 comprise a fastening assembly that may be used to secure the cover 120 to the housing structure 110, compressing the sealing elements or gaskets 150a, 150b between them, as will be described below. It is understood that the housing structure 110 and the cover 120 include the structure shown in FIG. 2 and described hereinabove, such as, for example, the second fastener receptacle 140 and the second cover aperture 122.

Each of the fastener receptacle bores 141 includes an enlarged-diameter lower portion 148 that defines the annular seat 144. Each of the cover apertures 122 includes an enlarged-diameter upper portion 134 that defines the annular seat 132 in the cover 120. In some embodiments, the nut 146 may be co-molded with the housing structure 110. Alternatively, the fastener receptacle bores 141 themselves may be internally threaded to secure the fasteners 170, thereby eliminating the need for the nuts 146.

The upper portion 134 of each of the cover apertures 122 receives the head 172 of a fastener 170 (and, optionally, a washer 174), so that the fastener head 172 engages the seat 132. The shank 176 of the fastener 170 thereby extends past the annular seat 132, through the bore 141 of the fastener receptacle 140, and into the lower portion 148 thereof for engagement with the nut 146. Accordingly, when the fasteners 170 are tightened into their respective nuts 146, the heads 172 of the fasteners 170 bear against their respective annular seats 132. As shown in FIG. 2, a cap 178 may be inserted into each of the cover apertures 122 to cover the heads of the fasteners 170, thereby reducing the ability of dirt, sand, and other debris to enter the utility box.

When the cover 120 is placed on top of the housing structure 110 with the sealing elements or gaskets 150a, 150b seated within the seating channels 160a 160b, respectively, the sealing elements or gaskets 150a, 150b are sandwiched between the cover 120 and the housing structure 110. Specifically, the underside of the peripheral frame 126 of the cover 120 bears against and provides a sealing engagement with the first sealing element or gasket 150a, and the lower edge 130 of the peripheral vertical flange 128 bears against and provides a sealing engagement with the second sealing element or gasket 150b. The sealing engagement between the cover frame 126 and the first sealing element or gasket 150a can be enhanced by providing the underside of the cover frame 126 with a downwardly extending peripheral lip 180 pressing against the first sealing element or gasket 150a. A groove or slot 182 can be defined in the first sealing element 150a. The downwardly extending peripheral lip 180 can be received in the groove or slot 182 of the first sealing element 150a. Likewise, the sealing engagement between the flange 128 and the second sealing element 150b may be enhanced by providing the second sealing element 150b with a groove or slot 184 that receives the flange 128. The sealing engagement between the frame 126 and the first sealing element 150a, and between the flange 128 and the second sealing element 150b, provide first and second liquid-tight seals between the cover 120 and the housing structure 110. Thus, in the illustrative embodiments, the utility box is advantageously configured with a double seal, thereby providing additional protection for the contents of the utility box.

The housing structure 110 and the cover 120 are configured such that when the cover 120 is initially placed on the housing structure 110, the sealing elements 150a, 150b are spaced slightly from, or bear lightly against, their respective seating channels 160a, 160b. When the fasteners 170 are tightened into their respective nuts 146 (FIG. 4 and FIG. 7), the sealing elements 150a, 150b are squeezed respectively between the peripheral frame portion 126 of the cover 120 and the first seating channel 160a, and between the flange 128 and the second seating channel 160b. The squeezing forces the elastomeric material of the sealing elements or gaskets 150a, 150b to bulge outwardly, thereby forming a seal at each of the seating channels 160a and 160b that resists entry of water, dust, debris, rodents, spiders, etc. into the interior of the utility box assembly 100.

The following description recites a method of securing the cover 120 to the housing structure 110 to form a utility box assembly in accordance with aspects of the present invention. With the housing structure 110 uncovered, the operator begins with the cover 120 in a state in which the fasteners 170 are withdrawn. The operator then positions the cover 120 in the open upper end 112 of the housing structure 110 so that the peripheral frame 126 of the cover rests on the peripheral rim 114 of the housing structure 110, with the fasteners 170 in the cover apertures 122a, 122b and aligned with the body apertures 140a, 140b. In this configuration, the sealing elements or gaskets 150a, 150b are positioned in their respective seating channels 160a, 160b, and the vertical peripheral flange 128 on the bottom or inner surface of the cover 120 is positioned inside the open upper end 112 of the housing structure 110. The operator next tightens the fasteners into the nuts 146. As the fasteners are tightened, the sealing elements or gaskets 150a, 150b are compressed between the cover 120 and the housing structure 110, thereby causing the sealing elements or gaskets 150a, 150b to bulge outwardly against the surfaces defining their respective channels 160a, 160b to create liquid tight seals at the seating channels 160a, 160b.

Figure 5:
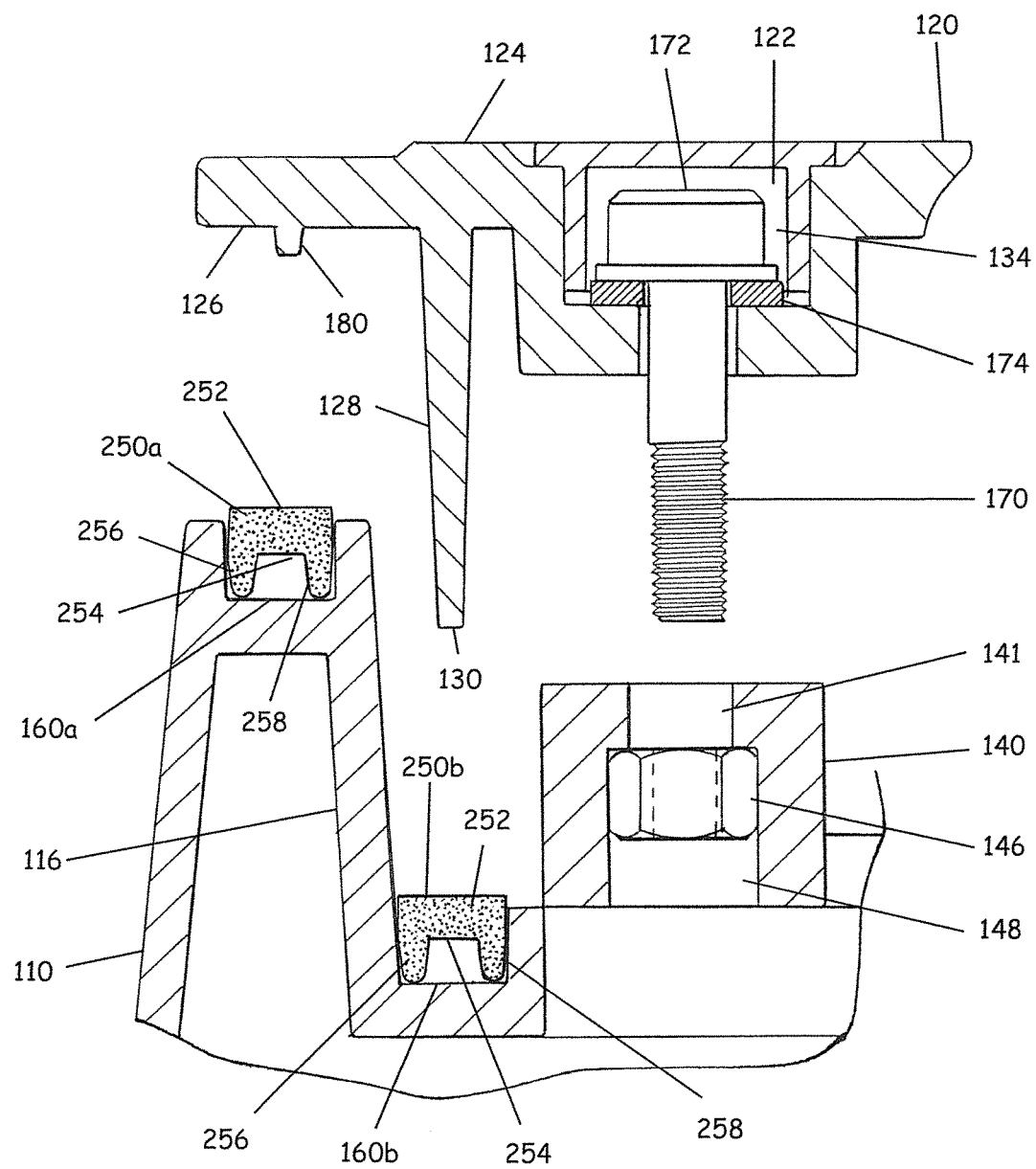
FIG. 5 is an exploded cross-sectional detail view of a portion of an underground utility box in accordance with another embodiment of the present disclosure and including an alternative sealing element embodiment.
Figure 6:
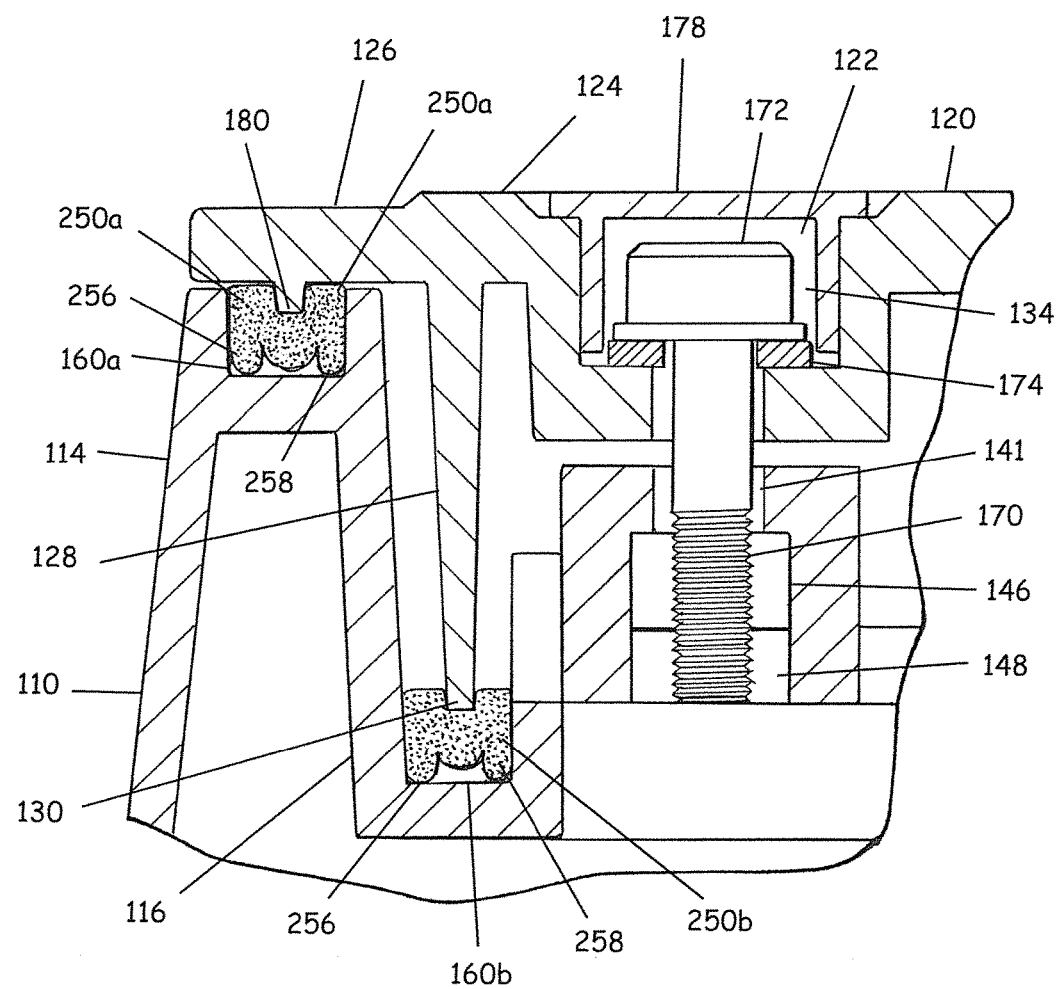
FIG. 6 is a cross-sectional detail view of a portion of the underground utility box shown in FIG. 5.

FIGS. 5 and 6 illustrate another embodiment of the present utility box assembly 200 shown with an alternative embodiment of a first sealing element 250a and a second sealing element 250b that provides a resilient, compressible sealing structure between the housing structure 110 and the cover 120. Except for the specific configuration of the sealing elements 250a, 250b, as described below, the utility box assembly 200 of FIGS. 5 and 6 is identical to the assembly 100 described above and illustrated in FIGS. 1-4. Thus, the above description of the assembly 100, being otherwise applicable to the assembly 200, need not be repeated here.

FIG. 5 shows the first and second sealing elements 250a, 250b seated in the first and second peripheral seating channels 160a, 160b, respectively, before the cover 120 is installed on the housing structure 110. Each of the first and second sealing elements 250a, 250b, which are advantageously made of the same material(s) as are the sealing elements 150a, 150b of the above described embodiment, includes a main body 252 and two legs 256, 258 extending vertically from opposite sides of the main body 252. The main body 252 and the two legs 256, 258 cooperatively define a groove or slot 254 between the legs 256, 258. Each of the two legs 256, 258 terminates in an end that can be rounded, flat, chamfered, or any suitable shape.

The dimensions of the first and second sealing elements 250a, 250b can vary depending on the size of the seating channels 160a, 160b. In one exemplary embodiment, the main body 252 can have a thickness of about 0.150 in. (about 3.8 mm) and a width of about 0.350 in. (about 8.9 mm). Each of the legs 256, 258 may have a width of about 0.094 in. (about 2.4 mm) at the main body 252, extending about 0.150 in. (about 3.8 mm) from the main body 252, with a slight taper toward the end, which may advantageously be rounded with a radius of curvature of about $\frac{1}{32}$ in. (about 0.8 mm). The two legs 256, 258 on each sealing element 250a, 250b are preferably, but not necessarily, of equal dimensions.

FIG. 6 shows the resilient deformation of the sealing elements 250a, 250b when the cover 120 is installed on the housing structure 110 in accordance with the above-described method of securing the cover to the housing structure. Specifically, when the cover 120 is placed on top of the housing structure 110 with the sealing elements 250a, 250b seated within the seating channels 160a 160b, respectively, the sealing elements 250a, 250b are sandwiched between the cover 120 and the housing structure 110. Specifically, the underside of the peripheral frame 126 of the cover 120 bears against the main body 252 of the first sealing element 250a, and the lower edge 130 of the peripheral vertical flange 128 bears against the main body 252 of the second sealing element 250b, thereby resiliently deforming the sealing elements 250a, 250b so that they create an effective, liquid-tight seal between the channels 160a, 160b and the cooperative peripheral structure of the cover 120. The resilient deformation between the cover frame 126 and the first sealing element 250a can be enhanced by providing a downwardly-extending peripheral lip 180 on the underside of the cover frame 126 that is configured to press against the main body 252 of the first sealing element 250a.

The resilient deformation of the sealing elements 250b causes their respective legs 256, 258 to bulge laterally outward against the side walls of the first and second seating channels 160a, 160b, respectively. Thus, as the first and second sealing elements 250a, 250b are resiliently compressed by the engagement between their main body portions 252 and the corresponding peripheral structure of the cover 120, the outer sides of their respective main bodies 252 and legs 256, 258 bulge outwardly and resiliently press against the side walls of the first and second seating channels 160a, 160b, respectively, thereby forming liquid tight seals between the cover 120 and the housing structure 110.

The above description presents the best mode contemplated for carrying out the present utility box assembly, and of the manner and process of making and using it, in such full, clear, concise, and exact terms as to enable any person skilled in the art to which it pertains to make and use this utility box assembly. This utility box assembly is, however, susceptible to modifications and alternate constructions from that discussed above that are fully equivalent. Consequently, this disclosure is not limited to the particular embodiments described and illustrated herein. On the contrary, this disclosure encompasses all modifications and alternate constructions coming within the spirit and scope of the following claims, which particularly point out and distinctly claim the subject matter of this disclosure.

What is claimed is:

1. A utility box assembly comprising:
   a housing having an open upper end;
   a first peripheral channel around the open upper end, the first peripheral channel defined between a first pair of opposing sidewalls;
   a second peripheral channel around the open upper end and disposed below the first peripheral channel and inwardly therefrom, the second peripheral channel defined between a second pair of opposing sidewalls;
   a cover configured to be secured to the housing so as to cover the open upper end and having a peripheral portion, the cover including a downwardly-extending flange;
   a first seal seated in the first peripheral channel, the first seal comprising a main body configured to be engaged by the peripheral portion of the cover, and a first and second legs extending downward from opposite sides of the main body, wherein the first seal is resiliently deformable by the engagement of the peripheral portion of the cover with the main body of the first seal so as to urge the first and second legs of the first seal against the first pair of opposing sidewalls defining the first peripheral channel; and
   a second seal seated in the second peripheral channel, the second seal comprising a main body, and a first and second legs extending from opposite sides of the main body of the second seal, wherein the second seal is resiliently deformable by the engagement of the downwardly extending peripheral flange with the main body of the second seal so as to urge the first and second legs of the second seal against the second pair of opposing sidewalls defining the second peripheral channel.

2. The utility box assembly of claim 1, wherein the cover further comprises a downwardly extending peripheral lip in the peripheral portion of the cover engaging with the first seal.

3. The utility box assembly of claim 1, wherein the first seal and the second seal are formed from a resilient, elastomeric material.

4. The utility box assembly of claim 1, further comprising a fastening assembly configured to secure the cover and the housing together with the first and second seals each being in engagement between the cover and the housing.

5. The utility box assembly of claim 1, wherein the housing comprises a plurality of walls defining a peripheral interior wall surface, and wherein the second peripheral channel is defined along the peripheral interior wall surface.

6. The utility box assembly of claim 1, wherein the ends of the two legs are rounded.

7. The utility box assembly of claim 1, wherein the ends of the two legs are flat.

8. A utility box assembly comprising:
   a housing having an open upper end configured with first and second peripheral channels surrounding the open upper end of the housing, the first peripheral channel being defined between a first pair of opposing sidewalls, the second peripheral channel being positioned below and inwardly from the first peripheral channel in the housing, the second peripheral channel being defined between a second pair of opposing sidewalls;
   a first seal seated in the first peripheral channel;
   a second seal seated in the second peripheral channel; and
   a cover configured to be secured to the housing so as to cover the open upper end of the housing while engaging and bearing against each of the first and second seals;
   wherein the first and second seals each comprise a main body and a first and second legs extending from opposite sides of the main body, and wherein the first and second seals are resiliently deformable by the engagement of the cover with the main body so as to urge the first and second legs of the first and second seals against the first and second pairs of opposing sidewalls defining the first and second peripheral channels, respectively.

9. The utility box assembly of claim 8, wherein the first and second seals are formed from a resilient, elastomeric material.

10. The utility box assembly of claim 8, wherein the housing comprises a peripheral rim, the first peripheral channel is defined in the peripheral rim, and the cover further comprises a downwardly extending peripheral lip configured to seat on the peripheral rim so as to engage the first seal when the cover is received in the open upper end of the housing.

11. The utility box assembly of claim 8, wherein the housing comprises a plurality of walls defining a peripheral interior wall surface, and the second peripheral channel is defined along the peripheral interior wall surface.

12. The utility box assembly of claim 8, wherein the cover comprises a downwardly extending peripheral lip engaging with the first seal, and a downwardly extending peripheral flange configured to be received through the open upper end of the housing and to bear against the second seal when the cover is received in the open upper end of the housing.

13. The utility box assembly of claim 8, wherein the ends of the two legs are rounded.

14. The utility box assembly of claim 8, wherein the ends of the two legs are flat.

15. The utility box assembly of claim 8, wherein the first and the second seals are formed from a resilient, elastomeric material.

* * * * *